(12) United States Patent
Lai et al.

(10) Patent No.: US 6,524,919 B2
(45) Date of Patent: Feb. 25, 2003

(54) METHOD FOR MANUFACTURING A METAL OXIDE SEMICONDUCTOR WITH A SHARP CORNER SPACER

(75) Inventors: Han-Chao Lai, Taichung (TW); Hung-Sui Lin, Hsin-Ying (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 29 days.

(21) Appl. No.: 09/950,215

(22) Filed: Sep. 7, 2001

(65) Prior Publication Data

US 2003/0013242 A1 Jan. 16, 2003

(30) Foreign Application Priority Data

Jul. 13, 2001 (TW) ........................................ 90117179 A

(51) Int. Cl.[7] .............................................. H01L 21/336
(52) U.S. Cl. ........................ 438/302; 438/305; 438/595
(58) Field of Search ................................ 438/302, 305, 438/306, 525, 595, 655, 664

(56) References Cited

U.S. PATENT DOCUMENTS 6,063,679 A * 5/2000 Gardner et al. ............. 438/595
6,346,449 B1 * 2/2002 Chang et al. ............... 438/305
6,362,062 B1 * 3/2002 Nandakumar ............... 438/595

\* cited by examiner

*Primary Examiner*—Chandra Chaudhari
(74) *Attorney, Agent, or Firm*—J.C. Patents

(57) ABSTRACT

A method for manufacturing a metal oxide semiconductor device is provided comprising the steps of: performing an ion implantation to form a source/drain region in the substrate having a gate formed on it and a spacer formed on the sidewalls of the gate; forming a self-aligned silicide layer on the exposed surface of the gate and the source/drain region; removing a portion of the spacer to form a substantially triangular spacer with sharp corners; performing a tilted pocket implantation to form pocket regions within the substrate beside the gate, and controlling the location of the pocket regions and the dopant distribution by adjusting the energy and angle of the tilted pocket implantation; performing a tilted-angle implantation to form a source/drain extension within the substrate beside the gate and underlying the spacer; using the thermal cycle process to adjust the junction depth and the doping profile of the source/drain extension.

19 Claims, 3 Drawing Sheets

METHOD FOR MANUFACTURING A METAL OXIDE SEMICONDUCTOR WITH A SHARP CORNER SPACER

CROSS-REFERENCE TO RELATED APPLICATION

This application claims the priority benefit of Taiwan application serial no. 90117179, filed Jul. 13, 2001.

BACKGROUND OF THE INVENTION

1. Field of Invention

The present invention relates to a method for manufacturing a semiconductor device. More particularly, the present invention relates to a method for manufacturing a metal oxide semiconductor (MOS) device.

2. Description of Related Art

The trend in the development of very large scale integration technology is that as the wafer where the integrated circuit devices are formed becomes larger, the line width of the device becomes narrower. This trend enhances the performance of the integrated circuits while reducing the cost of production. For a metal oxide semiconductor, as the channel length is shortened, the size of the device diminishes, and operation speed of the device increases.

As the device becomes smaller, however, the shortened channel length will create an overlap between the depletion layer of the source/drain and the channel. The overlapping area between the depletion layer of the source/drain and the channel gets larger as the channel length gets shorter, and when the channel length has been shortened substantially this leads to what is known as the "short channel effect". A common solution for this is to form a lightly doped drain in the device. When the line width of the device is smaller than 0.25 µm, the depth of the lightly doped drain must be persistently reduced, and the speed of the device slows down because of the increased resistance in the lightly doped drain. To avoid these drawbacks, a source/drain extension using a high dosage of dopants has recently been proposed to replace the lightly doped drain. A thermal process must be conducted on wafers having an implanted source/drain extension to repair damaged crystalline lattices of the substrate and to activate the implanted dopants before entry into the subsequent process. However, lateral diffusion of the source/drain extension occurs during the thermal process, so that the junction depth of the extension increases and the short channel effect gets even more serious than before.

In addition, when semiconductor device line width is below 0.25 µm, a high current leakage existing in the source/drain extension caused by the shortening of the channel length cannot be prevented. Therefore, a solution for this fault is proposed in which two implanted pocket regions next to the source/drain extension are formed at the two ends of the channel. A lightly-doped ion implantation is performed to form a source/drain extension in the substrate after a gate has been formed but before forming its spacers. A tilted pocket implantation into the substrate follows to form two pocket regions.

The pocket regions formed according to the method above can effectively block the current leakage that occurs in the channel as line width of the device decreases to 0.25 µm. However, after line width of the device gets below 0.13 µm, what has been termed the "reverse short channel effect" (RSCE) arises as a result of the close proximity of the two pocket regions formed by the conventional process. When the length of the channel is minimized to a particular extent, the threshold voltage of the device rises so quickly that it causes device breakdown. Moreover, in the prior art, the location of the pocket regions formed in the substrate is relatively deep, therefore their ability to block the drawback caused by the short channel effect is not sufficient.

SUMMARY OF THE INVENTION

Therefore, it is an object of the present invention to provide a fabrication method for a metal oxide semiconductor device that can control the junction depth and the implanting profile of the source/drain extension of the device.

It is another object of the present invention to provide a fabrication method for a metal oxide semiconductor device that renders the implanted pocket regions close to the surface of the substrate.

It is a further object of the present invention to provide a fabrication method for a metal oxide semiconductor device that can restrain the short channel effect and reduce the reverse short channel effect to further complete the fabrication of a deep sub-micron device.

The present invention provides a fabrication method for a metal oxide semiconductor device comprising the following steps. First, a substrate is provided, wherein a gate is formed on the substrate and a spacer is formed on the sidewalls of the gate. Subsequently, a source/drain region is formed in the substrate beside the gate. The preceding process further includes a step of forming a self-aligned silicide layer on the exposed surface of the gate and the source/drain region. Subsequently, a portion of the spacer is removed by using an etching process to form a substantially triangular spacer with sharp corners, and then a tilted ion implantation for the substrate is performed to form pocket regions within the substrate beside the gate. By adjusting the energy and the angle of the tilted ion implantation, the location of the pocket regions and the distribution of dopants can be controlled in order to form the pocket regions near the substrate surface. After this, a tilted-angle implantation for the substrate is performed to form a source/drain extension located within the substrate beside the gate and underlying the sharp-corner spacer. Finally, the junction depth and the dopant profile of the source/drain extension are adjusted by using a thermal cycle process.

In addition, in the present invention after formation of the substantially triangular spacer with sharp corners, this method for fabricating a metal oxide semiconductor device further comprises the ability to switch the order of the steps for performing a tilted pocket implantation and for forming a source/drain extension. That is, it is allowable, after formation of the sharp-corner spacer, to perform a tilted-angle implantation into the substrate to form the source/drain extension within the substrate beside the gate and underlying the sharp-corner spacer, and then perform a tilted pocket implantation into the substrate to form the pocket regions within the substrate beside the gate, keeping the order of the other steps the same.

In the present invention, a sharp-corner spacer is used to reduce the implantation depth in the substrate, so that the pocket regions may be located near the surface of the substrate and the interval between the two pocket regions next to the source/drain extension can be increased to prevent the two pocket regions overlapping. Thus, the short channel effect is inhibited and the reverse short channel effect also decreased. Moreover, the sharp-corner spacer is also used to reduce the implantation depth so as to form a relatively shallow source/drain extension within the substrate beside the gate and underlying the spacer. In the present invention, the lateral diffusion effect of the source/drain extension is alleviated and the junction depth of the source/drain extension won't become too deep due to the thermal process, therefore the short channel effect is restrained. In addition, after a subsequent thermal cycle process, the junction depth and the dopant profile of the source/drain extension can be adjusted more accurately to suppress the short channel effect.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
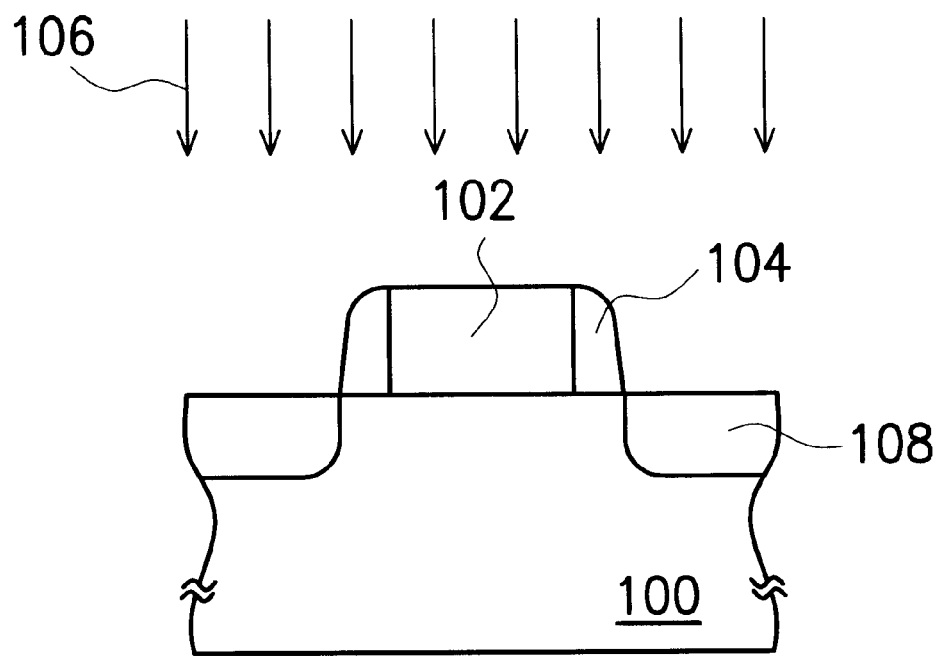
FIGS. 1A through 1E are schematic, cross-sectional views, illustrating successive steps in fabricating a metal oxide semiconductor device according to a preferred embodiment of the present invention.
Figure 1B:
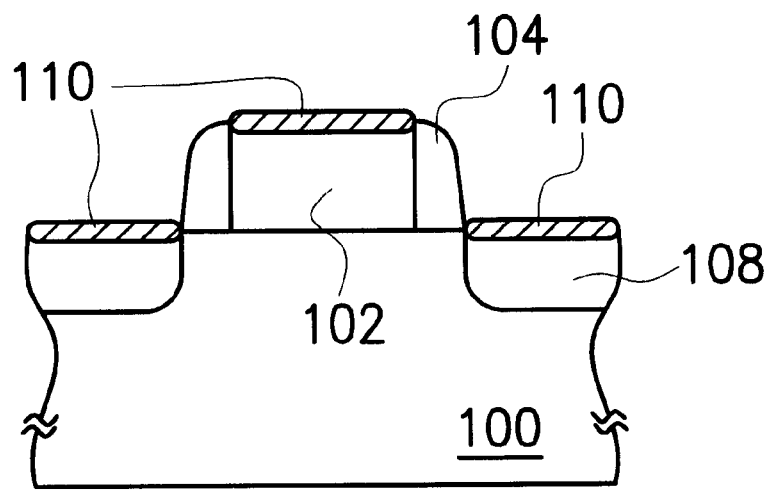

Referring to FIG. 1A, a semiconductor silicon substrate 100 is provided. A gate 102 is formed over the substrate 100 and a spacer 104 is formed on the sidewalls of the gate 102. The spacer 104 includes silicon nitride, the forming method of which, for example, is that a conformal silicon nitride layer is formed over the substrate 100 and then the silicon nitride layer is etched anisotropically to form the spacer 104. Subsequently, an ion implantation 106 is performed to form a source/drain 108 in the substrate 100 beside the spacer 104. Referring to FIG. 1B, a self-aligned silicide layer 110 is formed on the exposed surface of the gate 102 and the source/drain 108. The method for forming the self-aligned silicide layer 110 is that a metal layer, such as titanium, is formed over the substrate 100, covering the gate 102, and then by performing a thermal process, the metal layer reacts with the polysilicon gate 102 and the source/drain 108 to form a metal silicide layer. Next, by removing the un-reacted metal layer, the self-aligned silicide layer 110 is formed.

Figure 1C:
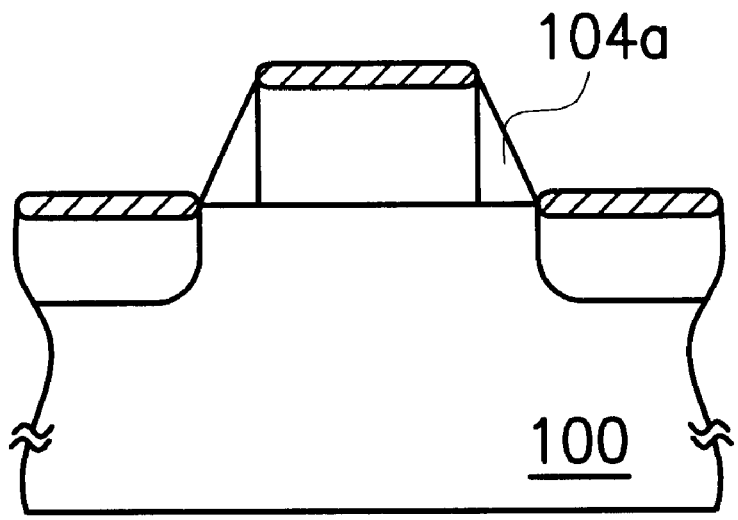

Referring to FIG. 1C, a portion of the spacer 104 is etched by a particular anisotropic etching process so as to form a substantially triangular spacer with sharp corners.

Figure 1D:
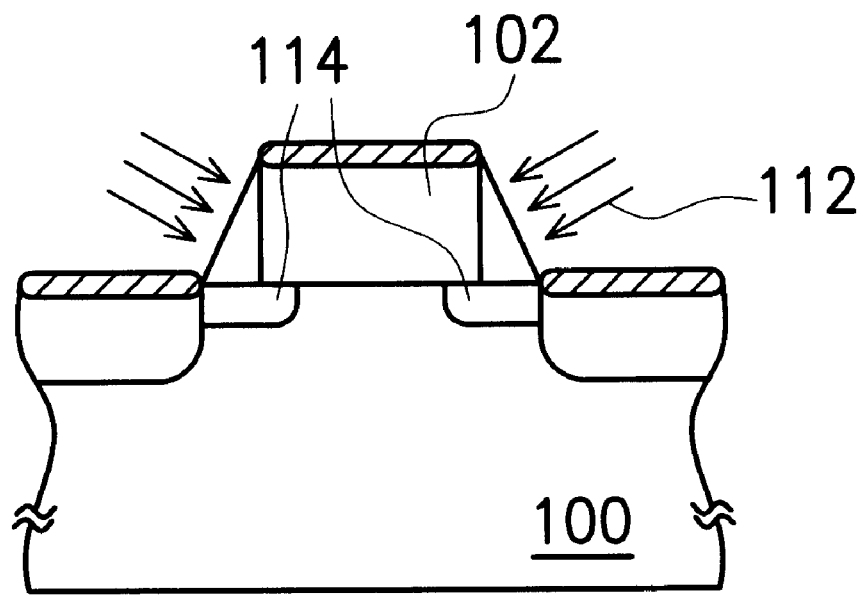

Referring to FIG. 1D, a tilted pocket implantation 112 for the substrate 100 is performed to form pocket regions 114 within the substrate 100 beside the gate 102. By adjusting the energy and the angle of the tilted pocket implantation 112, the location of the pocket regions 114 and the distribution of dopants can be controlled, so the pocket regions 114 can be formed near the surface of the substrate 100. The dopant for forming the pocket regions 114 is, for example, gallium ions or indium ions.

Figure 1E:
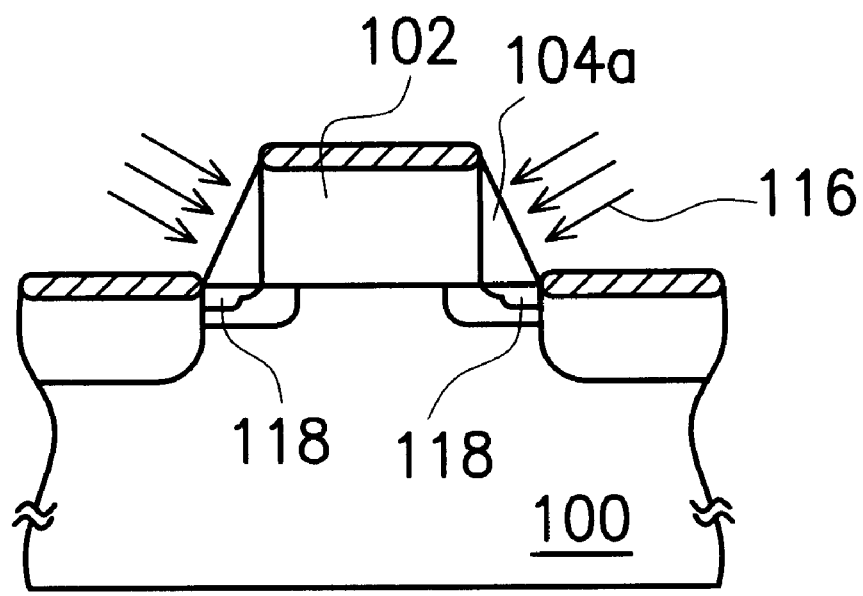

Finally, referring to FIG. 1E, a tilted-angle implantation 116 for the substrate 100 is performed to form a source/drain extension 118 within the substrate 100 beside the gate 102 and underlying the spacer 104a, wherein the dopant for forming the source/drain extension 118 is, for example, phosphoric ions or arsenic ions. A thermal cycle process is further conducted to adjust the junction depth and the dopant profile of the source/drain extension 118.

In addition, the steps shown in FIG. 1D and FIG. 1E, respectively, in the preferred embodiment of the present invention can be switched, that is, in FIG. 1E the step of performing the tilted-angle implantation 116 into the substrate 100 to form the source/drain extension 118 within the substrate 100 beside the gate 102 and underlying the spacer 104a could be prior to the step of performing the tilted pocket implantation 112 into the substrate 100 to form the pocket regions 114 within the substrate 100 beside the gate 102, in FIG. 1D.

To summarize the described above, the present invention is characterized as follows:

1. In the present invention, a sharp-corner spacer is used to reduce the depth of ion implantation into the substrate, so that the pocket regions may be located near the surface of the substrate and the interval between the two pocket regions next to the source/drain extension can be increased (to prevent the two pocket regions from overlapping). Thus, the short channel effect can be inhibited and the reverse short channel effect can be decreased.

2. Referring to FIG. 1D, in the present invention, the tilted pocket implantation 112 passes through the even surface of the triangular spacer 104a and then enters the substrate 100, therefore the location of the pocket regions and the dopant distribution can be controlled more accurately than in the prior art. As a result, the pocket regions will be closer to the source/drain extension.

3. In the present invention, the sharp-corner spacer is used to reduce the depth of ion implantation so as to form a relatively shallow source/drain extension within the substrate beside the gate and underlying the spacer. In the present invention, the lateral diffusion effect of the source/drain extension can be alleviated and the junction depth of the source/drain extension won't become too deep due to the thermal process, therefore, the short channel effect is restrained.

4. In addition, a subsequent thermal cycle process adjusts more accurately the junction depth and the dopant profile of the source/drain extension.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a metal oxide semiconductor device, comprising the steps of:

providing a substrate, wherein a gate is formed thereon and a spacer is formed on the sidewalls of the gate;

forming a source/drain region in the substrate beside the gate;

forming a plurality of self-aligned silicide layers on the exposed surface of the gate and the source/drain region;

removing a portion of the spacer by an etching process to form a sharp-corner spacer;

performing a tilted pocket implantation into the substrate to form pocket regions within the substrate beside the gate, and locating the pocket regions near the surface of the substrate by adjusting an energy and an angle of the tilted pocket implantation; and performing a tilted-angle implantation into the substrate to form a source/drain extension within the substrate beside the gate and underlying the sharp-corner spacer.

2. The method of claim 1, wherein the sharp-corner spacer is substantially a triangle in a cross-sectional view.

3. The method of claim 1, wherein the order of the steps of forming the pocket regions and forming the source/drain extension can be switched.

4. The method of claim 1, wherein further comprising a thermal cycle process after forming the source/drain extension to adjust a junction depth and a dopant profile of the source/drain extension.

5. The method of claim 1, wherein the spacer comprises silicon nitride.

6. The method of claim 1, wherein the step of forming the self-aligned silicide layers comprises the steps of:

forming a metal layer over the substrate and covering the gate;

performing a thermal process to cause the reaction between the metal layer and the gate and the source/drain region to form the self-aligned silicide layers; and removing the un-reacted metal layer.

7. The method of claim 6, wherein the metal layer comprises titanium.

8. The method of claim 1, wherein the dopant of the source/drain extension is selected from the group consisting of phosphorous ions and arsenic ions.

9. The method of claim 1, wherein the dopant of the pocket regions is selected from the group consisting of gallium ions and indium ions.

10. A method for manufacturing a metal oxide semiconductor device, comprising the steps of:

providing a substrate, where a gate is formed thereon and a spacer formed on the sidewalls of the gate;

forming a source/drain region in the substrate beside the gate;

removing a portion of the spacer by an etching process to form a sharp-corner spacer;

performing a tilted pocket implantation into the substrate to form pocket regions within the substrate beside the gate, and locating the pocket regions near the surface of the substrate by adjusting the energy and the angle of the tilted pocket implantation; and performing a tilted-angle implantation into the substrate to form a source/drain extension within the substrate beside the gate and underlying the sharp-corner spacer.

11. The method of claim 10, wherein the sharp-corner spacer is substantially a triangle in a cross-sectional view.

12. The method of claim 10, wherein the order of the steps of forming the pocket regions and forming the source/drain extension can be switched.

13. The method of claim 10, further comprising a step of forming a plurality of self-aligned silicide layers on the gate and the source/drain region following the step of forming the spacer.

14. The method of claim 13, wherein the formation of the self-aligned silicide layers comprises the steps of:

forming a metal layer over the substrate and covering the gate;

performing a thermal process to cause the reaction between the metal layer and the gate and the source/drain region to form the self-aligned silicide layers; and removing the un-reacted metal layer.

15. The method of claim 14, wherein the metal layer comprises titanium.

16. The method of claim 10, wherein a thermal cycle process is further included after the step of forming the source/drain extension, in order to adjust the junction depth and the dopant profile of the source/drain extension.

17. The method of claim 10, wherein the spacer comprises silicon nitride.

18. The method of claim 10, wherein the dopant of the source/drain extension is selected from the group consisting of phosphorous ions and arsenic ions.

19. The method of claim 10, wherein the dopant of the pocket regions is selected from the group consisting of gallium ions and indium ions.

* * * * *